US012406412B2

United States Patent
Mandava et al.

(10) Patent No.: US 12,406,412 B2
(45) Date of Patent: Sep. 2, 2025

(54) SYSTEM AND METHOD FOR DEEP LEARNING-BASED CHEMICAL SHIFT ARTIFACT MITIGATION OF NON-CARTESIAN MAGNETIC RESONANCE IMAGING DATA

(71) Applicant: GE Precision Healthcare LLC, Wauwatosa, WI (US)

(72) Inventors: Sagar Mandava, Atlanta, GA (US); Robert Marc Lebel, Calgary (CA); Michael Carl, San Marcos, CA (US); Florian Wiesinger, Freising (DE)

(73) Assignee: GE Precision Healthcare LLC, Wauwatosa, WI (US)

( * ) Notice: Subject to any disclaimer, the term of this patent is extended or adjusted under 35 U.S.C. 154(b) by 402 days.

(21) Appl. No.: 18/102,834

(22) Filed: Jan. 30, 2023

(65) Prior Publication Data
US 2024/0257414 A1    Aug. 1, 2024

(51) Int. Cl.
*G06N 3/08*      (2023.01)
*G01R 33/48*     (2006.01)
(Continued)

(52) U.S. Cl.
CPC ........ *G06T 11/008* (2013.01); *G01R 33/4824* (2013.01); *G01R 33/5608* (2013.01); *G06N 3/08* (2013.01); *G06T 2210/41* (2013.01)

(58) Field of Classification Search
CPC .............. G06T 11/008; G06T 2210/41; G01R 33/4824; G01R 33/5608; G01R 33/56509;
(Continued)

(56) References Cited

U.S. PATENT DOCUMENTS 10,635,943 B1    4/2020  Lebel et al.
10,969,451 B1    4/2021  Wiesinger et al.
(Continued)

FOREIGN PATENT DOCUMENTS

CN    110095742 A  *  8/2019   ......... G01R 33/5608
WO    2021197955        10/2021

OTHER PUBLICATIONS

Haskell et al., "Off-resonance artifact correction for MRI: A review", Nov. 2022 (Year: 2022).*

(Continued)

*Primary Examiner* — Charlotte M Baker
(74) *Attorney, Agent, or Firm* — Fletcher Yoder, P.C.

(57) ABSTRACT

A computer-implemented method for generating a chemical shift artifact corrected reconstructed image from magnetic resonance imaging (MRI) data includes inputting into a trained deep neural network an image generated from the MRI data acquired during a non-Cartesian MRI scan of a subject. The method also includes utilizing the trained deep neural network to generate the chemical shift artifact corrected reconstructed image from the image, wherein the trained deep neural network was trained utilizing a tissue mixing model that models interactions between different tissue types to mitigate chemical shift artifacts. The method further includes outputting from the trained deep neural network the chemical shift artifact corrected reconstructed image.

17 Claims, 10 Drawing Sheets

(51) Int. Cl.
*G01R 33/56* (2006.01)
*G06T 11/00* (2006.01)

(58) Field of Classification Search
CPC .... G01R 33/56536; G01R 33/56; G06N 3/08; G06N 3/045; G06N 3/02
USPC ......................................................... 382/131
See application file for complete search history.

(56) References Cited

U.S. PATENT DOCUMENTS

| | | |
|---|---|---|
| 11,257,191 B2 | 2/2022 | Litwiller et al. |
| 11,341,616 B2 | 5/2022 | Wang et al. |
| 11,346,912 B2 | 5/2022 | Guidon et al. |
| 2019/0277935 A1 | 9/2019 | Zeng et al. |
| 2020/0126190 A1 | 4/2020 | Lebel |

OTHER PUBLICATIONS

Zeng et al., "Deep Residual Network for Off-Resonance Artifact Correction With Application to Pediatric Body MRA With 3D Cones," Magnetic Resonance in Medicine, 2019, Wiley Online library, vol. 82, 14 pgs.

Lim et al., "Deblurring for Spiral Real-Time MRI Using Convolutional Neural Networks," Magnetic Resonance in Medicine, 2020, Wiley Online library, vol. 84, 15 pgs.

Chen et al., "Ultrafast Water—Fat Separation Using Deep Learning—Based Single-Shot MRI," Magnetic Resonance in Medicine, 2022, Wiley Online library, vol. 87, 16 pgs.

Li et al., "Accelerating Multi-Echo Chemical Shift Encoded Water—Fat MRI Using Model-Guided Deep Learning." Magnetic Resonance in Medicine, 2022, Wiley Online library, vol. 88, 15 pgs.

* cited by examiner

SYSTEM AND METHOD FOR DEEP LEARNING-BASED CHEMICAL SHIFT ARTIFACT MITIGATION OF NON-CARTESIAN MAGNETIC RESONANCE IMAGING DATA

BACKGROUND

The subject matter disclosed herein relates to medical imaging and, more particularly, to systems and methods for deep learning-based chemical shift artifact mitigation of non-Cartesian magnetic resonance imaging (MRI) data.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Non-Cartesian MRI like radial and spiral scanning is susceptible to chemical shift off-resonance effects that lead to blurring and, in some cases, destructive interference effects at fat-water tissue interfaces. While these artifacts can be mitigated by scanning at a high readout bandwidth (e.g., 400 hertz (Hz)/pixel), this comes at the cost of increased noise (e.g., acoustic and thermal) and gradient hardware requirements. In some cases, it can also lead to increased scan time (e.g., due to gradient heating limitations) which can result in poorer signal-to-noise efficiency. In some cases, these artifacts cannot be mitigated based on maximum gradient amplitude or other radio frequency (RF) limitations. Therefore, there is a need to mitigate these artifacts while scanning at a lower bandwidth.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for generating a chemical shift artifact corrected reconstructed image from magnetic resonance imaging (MRI) data is provided. The method includes inputting into a trained deep neural network an image generated from the MRI data acquired during a non-Cartesian MRI scan of a subject. The method also includes utilizing the trained deep neural network to generate the chemical shift artifact corrected reconstructed image from the image, wherein the trained deep neural network was trained utilizing a tissue mixing model that models interactions between different tissue types to mitigate chemical shift artifacts. The method further includes outputting from the trained deep neural network the chemical shift artifact corrected reconstructed image.

In another embodiment, a deep learning-based chemical shift artifact correction system for generating a chemical shift artifact corrected data from magnetic resonance imaging (MRI) data is provided. The system includes memory encoding processor-executable routines. The system also includes a processor configured to access the memory and to execute the processor-executable routines, wherein the routines, when executed by the processor, cause the processor to perform actions. The actions include inputting into a trained deep neural network an image generated from the MRI data acquired during a non-Cartesian MRI scan of a subject. The actions also include utilizing the trained deep neural network to generate the chemical shift artifact corrected data from the image, wherein the trained deep neural network was trained utilizing a tissue mixing model that models interactions between different tissue types to mitigate chemical shift artifacts. The actions further include outputting from the trained deep neural network the chemical shift artifact corrected data.

In a further embodiment, a non-transitory computer-readable medium, the computer-readable medium including processor-executable code that when executed by a processor, causes the processor to perform actions. The actions include inputting into a trained deep neural network an image generated from magnetic resonance imaging (MRI) data acquired during a non-Cartesian MRI scan of a subject. The actions also include utilizing the trained deep neural network to generate the chemical shift artifact corrected data from the image, wherein the trained deep neural network was trained utilizing a tissue mixing model that models interactions between different tissue types to mitigate chemical shift artifacts. The actions further include outputting from the trained deep neural network the chemical shift artifact corrected data.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
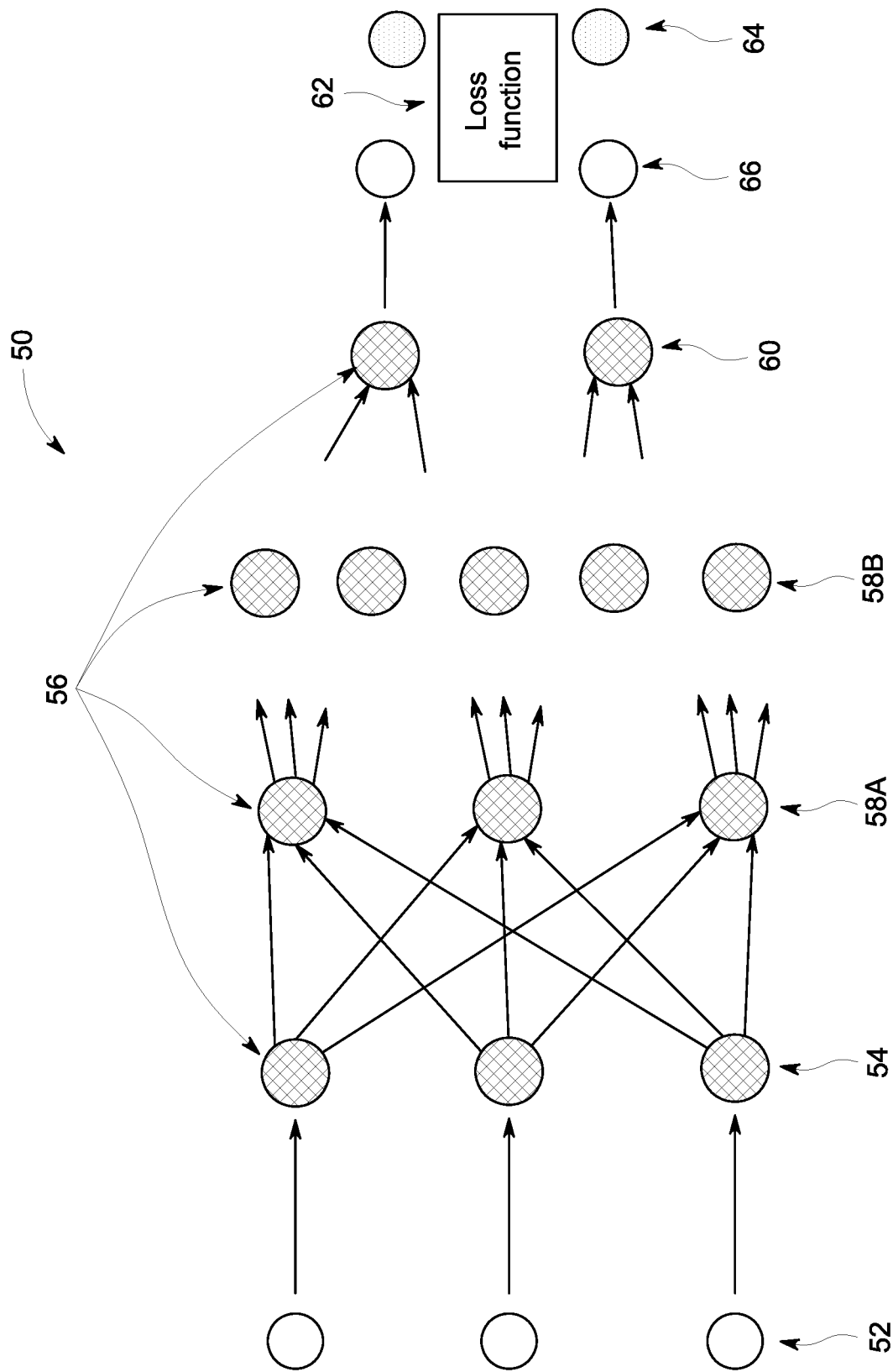
FIG. 1 depicts an example of an artificial neural network for training a deep learning model, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Deep-learning (DL) approaches discussed herein may be based on artificial neural networks, and may therefore encompass one or more of deep neural networks, fully connected networks, convolutional neural networks (CNNs), unrolled neural networks, perceptrons, encoders-decoders, recurrent networks, transformer networks, wavelet filter banks, u-nets, general adversarial networks (GANs), dense neural networks, or other neural network architectures. The neural networks may include shortcuts, activations, batch-normalization layers, and/or other features. These techniques are referred to herein as DL techniques, though this terminology may also be used specifically in reference to the use of deep neural networks, which is a neural network having a plurality of layers.

As discussed herein, DL techniques (which may also be known as deep machine learning, hierarchical learning, or deep structured learning) are a branch of machine learning techniques that employ mathematical representations of data and artificial neural networks for learning and processing such representations. By way of example, DL approaches may be characterized by their use of one or more algorithms to extract or model high level abstractions of a type of data-of-interest. This may be accomplished using one or more processing layers, with each layer typically corresponding to a different level of abstraction and, therefore potentially employing or utilizing different aspects of the initial data or outputs of a preceding layer (i.e., a hierarchy or cascade of layers) as the target of the processes or algorithms of a given layer. In an image processing or reconstruction context, this may be characterized as different layers corresponding to the different feature levels or resolution in the data. In general, the processing from one representation space to the next-level representation space can be considered as one 'stage' of the process. Each stage of the process can be performed by separate neural networks or by different parts of one larger neural network.

The present disclosure provides systems and methods for deep learning-based generation (e.g., retrospectively or subsequent to acquisition of the MRI data) of chemical shift artifact corrected reconstructed images from MRI data. In particular, a trained deep neural network utilizes a tissue mixing model that models fat-water interactions to mitigate chemical shift artifacts in generating chemical shift artifact corrected reconstructed images. In particular, a raw image (i.e., image generated from complex-combined individual receiver coil channels but prior to further processing) generated from the MRI data acquired during a non-Cartesian MRI scan (e.g., acquisition or sampling of k-space utilizing a spiral, radial, or zig-zag trajectory) of a subject is input into the trained deep neural network. The non-Cartesian scan may be an on-resonance scan (i.e., center frequency on water) or an off-resonance image (i.e., center frequency not on water). The disclosed embodiments utilize the trained deep neural network to generate the chemical shift artifact corrected reconstructed image from the raw image, which is then outputted. In certain embodiments, the tissue mixing model is a partial volume map for approximating a respective fraction of different tissue types (such as fat and water) in each voxel of the raw image. The tissue mixing model is configured to simulate phase accrual in fat tissue and water tissue based on known chemical shift evolution. The tissue mixing model may simulate phase accrual in the different tissue types (e.g., multiple fat tissue peaks and water tissue, fat tissue, water tissue, and silicone, etc.) based on known chemical shift evolution. The trained deep neural network is trained to make the raw image (e.g., acquired at a lower receiver bandwidth to appear in the chemical shift artifact corrected reconstructed image as an image acquired at a higher receiver bandwidth (i.e. greater than the lower receiver bandwidth). In certain embodiments, besides the raw image, physics-based information (e.g., an off-resonance MRI image retrospectively generated from the raw data, scalar information, or $B_0$ map) is inputted into the trained deep neural network, wherein the trained deep neural network utilizes the additional information to guide correction in generating the chemical shift artifact corrected reconstructed image.

The disclosed embodiments enable improved image quality by mitigating chemical shift artifacts (e.g., fat-water tissue interface artifacts) in MRI data. The disclosed embodiments also enable improved image quality by reducing blurring and performing de-noising and de-ringing in the MRI data. Reduction of the chemical shift artifacts makes the images appear more "MR like" (i.e., akin to high bandwidth images) making it easier for radiologists to read them. The disclosed embodiments further enable improvements in post-processing tasks (e.g., bone rendering for zero echo time (ZTE) type scans, or synthetic Computed Tomography (CT) image conversion).

As discussed herein, as part of the initial training of deep learning processes to solve a particular problem, training data sets may be employed that have known initial values (e.g., input images, magnetic resonance data, and so forth) and known or desired values for a final output of the deep learning process. The training of a single stage may have known input values corresponding to one representation space and known output values corresponding to a next-level representation space. In this manner, the deep learning processes may process (in a supervised or guided manner) the known or training data sets until the mathematical relationships between the initial data and desired output(s) are discerned and/or the mathematical relationships between the inputs and outputs of each layer are discerned and characterized. Similarly, separate validation data sets may be employed in which both the initial and desired target values are known, but only the initial values are supplied to the trained deep learning processes, with the outputs then being compared to the outputs of the deep learning algorithm to validate the prior training and/or to prevent over-training.

With the preceding in mind, FIG. 1 schematically depicts an example of an artificial neural network 50 that may be trained as a deep learning model as discussed herein. In this example, the network 50 is multi-layered, with the multiple layers including an input layer 54 (configured to receive input data 52), hidden layers 58A, 58B, and so forth, and an output layer 60 configured to generate an output 66, which in some contexts may be compared to a target output 64 (e.g., a training target). Each layer, in this example, is composed of a plurality of "neurons" or nodes 56. The number of neurons 56 may be constant between layers or, as depicted, may vary from layer to layer. Neurons 56 at each layer generate respective outputs that serve as inputs to the neurons 56 of the next hierarchical layer. In practice, a weighted sum of the inputs with an added bias is computed to "excite" or "activate" each respective neuron of the layers according to an activation function, such as rectified linear unit (ReLU), sigmoid function, hyperbolic tangent function, or otherwise specified or programmed. The outputs 66 of the output layer 60 constitute the network output which, in conjunction with a target output 64, may be used to compute some loss or error function 62 that can be backpropagated to guide the network training.

The loss or error function 62 measures the difference between the network output and the training target. In certain implementations, the loss function may be the mean squared error (MSE) of the voxel-level values, Fourier-domain values, sinogram values, line-integral values, attenuated line-integral values, partial-line-integral values, or attenuated partial line-integral values and/or may account for differences involving other image features, such as image gradients or other image statistics. Alternatively, the loss function 62 could be defined by other metrics associated with the particular task in question, such as a softmax function.

Figure 2:
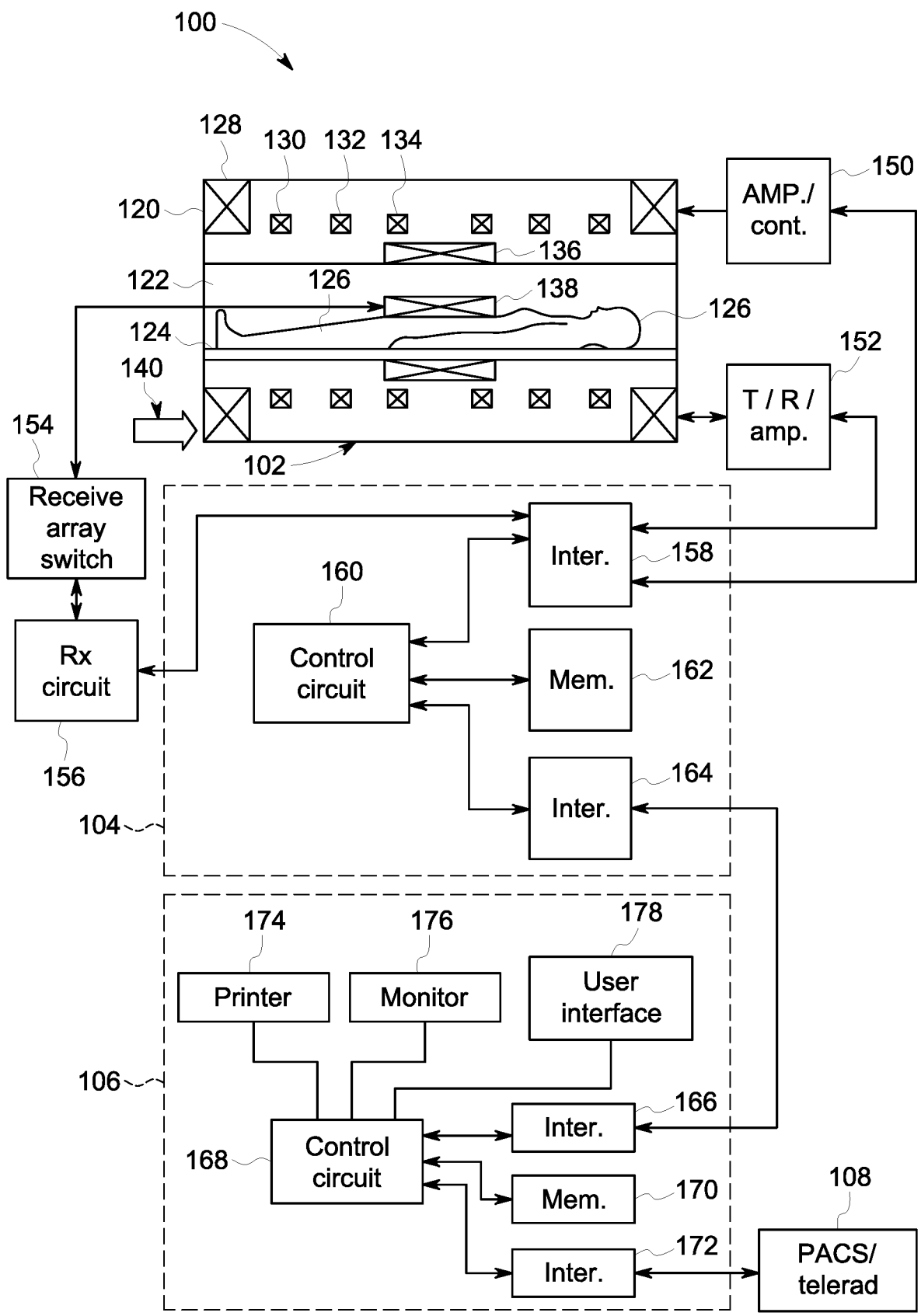
FIG. 2 illustrates an embodiment of a magnetic resonance imaging (MRI) system suitable for use with the disclosed technique.

With the preceding in mind, FIG. 2 is a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 is configured to generate radio frequency pulses for exciting the certain gyromagnetic nuclei within the patient. In addition to the coils that may be local to the scanner 102, the system 100 also includes a set of receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, B0. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 3:
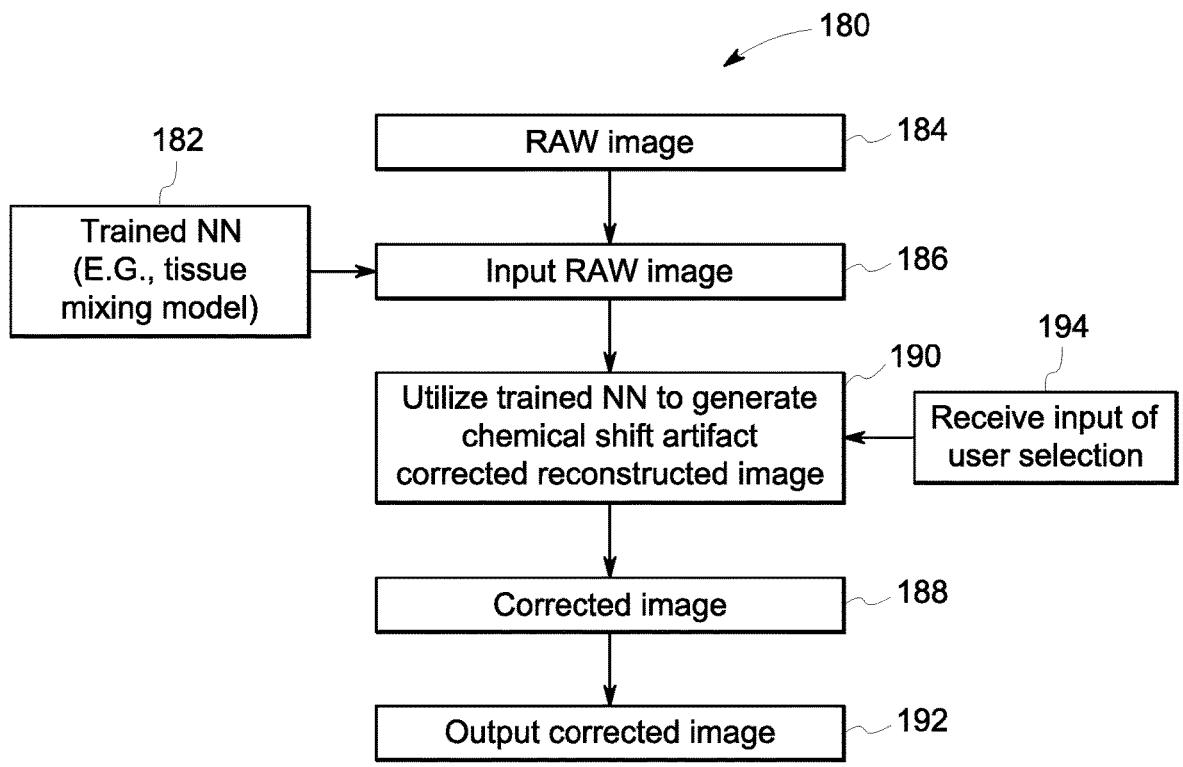
FIG. 3 is a flow chart of a method for generating a chemical shift artifact corrected reconstructed image from MRI data (e.g., utilizing a single input image), in accordance with aspects of the present disclosure.

FIG. 3 is a flow chart of a method 180 for generating a chemical shift artifact corrected reconstructed image from magnetic resonance imaging (MRI) data. One or more steps of the method 180 may be performed by processing circuitry of the magnetic resonance imaging system 100 in FIG. 2 or a remote computing system. One or more steps of the method 180 may be performed simultaneously or in a different order from that depicted in FIG. 3.

The method 180 includes inputting into a trained deep neural network (NN) 182 a raw image 184 (i.e., image generated from complex-combined individual receiver coil channels but prior to further processing) generated from the MRI data acquired during a non-Cartesian MRI scan of a subject (block 186). The raw image 184 is generated from the MRI data acquired during a non-Cartesian MRI scan of a subject is input into the trained deep neural network 182. The MRI data (e.g., k-space data) may have been acquired or sampled utilizing a spiral trajectory, a radial trajectory, a zig-zag trajectory, or any other non-Cartesian trajectory. The non-Cartesian scan may be an on-resonance scan (i.e., center frequency on water) or an off-resonance image (i.e., center frequency not on water). The raw image 184 may be acquired during a scan at a lower bandwidth. In certain embodiments, the raw image 184 is the only image and/or information inputted into the trained deep neural network 182 as depicted in the method 180. In certain embodiments, additional information (e.g., physics-based information) is inputted into the trained deep neural network 182 to guide the mitigation or correction of chemical shift artifacts in the raw image 184.

The trained deep neural network 182 is configured to utilize a tissue mixing model that models fat-water interactions to mitigate chemical shift artifacts in generating chemical shift artifact corrected reconstructed images. The trained deep neural network 182 is also configured to perform de-noising and de-ringing. In certain embodiments, the tissue mixing model is a partial volume map (e.g., for two classes, fat and water) for approximating a respective fraction of fat and water (e.g., in a range from 0 to 1) in each voxel of the raw image 184. The tissue mixing model is configured to simulate phase accrual in fat tissue and water tissue based on known chemical shift evolution. In certain embodiments, the tissue mixing model may simulate phase accrual in multiple tissue components (e.g., multiple fat tissue peaks and water tissue, fat tissue, water tissue, and silicone, etc.) based on known chemical shift evolution. The trained deep neural network is trained to make the raw image 184 (e.g., acquired at a lower receiver bandwidth appear in the chemical shift artifact corrected reconstructed image as an image acquired at a higher receiver bandwidth (i.e., higher than the lower bandwidth). As noted above, the trained deep neural network 182 may be utilized on MRI data acquired from both on-resonance scanning and off-resonance scanning (including intentionally off-resonant scanning such as partially in phase imaging). The trained deep neural network 182 works synergistically with off-resonant scanning.

The method 180 also includes utilizing the trained deep neural network 182 to generate a chemical shift artifact corrected reconstructed image 188 from the raw image 184, wherein the trained deep neural network 182 utilizes the tissue mixing model that models fat-water interactions to mitigate chemical shift artifacts (block 190). In certain embodiments, both the raw image 184 and the chemical shift artifact corrected reconstructed image 188 are two-dimensional (2D) images. In certain embodiments, both the raw image 184 and the chemical shift artifact corrected reconstructed image 188 are three-dimensional (3D) images. The method 180 further includes outputting from the trained deep neural network the chemical shift artifact corrected reconstructed image (block 192).

In certain embodiments, the method 180 includes receiving an input of a user selection of either fully removing or partially removing a chemical shift artifact in the raw image 184 (block 194). When the input of the user selection is for fully removing the chemical shift artifact, the chemical shift artifact is fully removed from the chemical shift artifact corrected reconstructed image 188. When the input of the user selection is partially removing the chemical shift artifact, the chemical shift artifact is partially removed from the chemical shift artifact corrected reconstructed image 188. In certain embodiments, different trained deep neural networks may be utilized for chemical shift artifact correction. For example, a first trained deep neural network may be utilized for partially removing chemical shift artifacts and a second trained deep neural network may be utilized for fully removing chemical shift artifacts.

Figure 4:
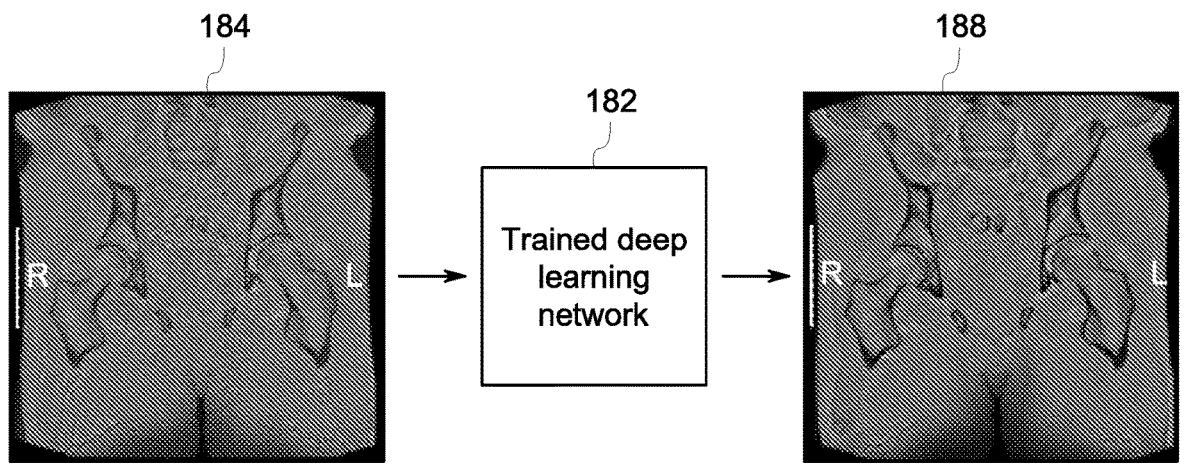
FIG. 4 is a schematic diagram illustrating the mitigation of chemical shift artifacts in a raw image, in accordance with aspects of the present disclosure.

FIG. 4 is a schematic diagram illustrating the mitigation of chemical shift artifacts in the raw image 184 (i.e., image generated from complex-combined individual receiver coil channels but prior to further processing). As depicted in FIG. 4, the raw image 184 is input into the trained deep neural network 182. The raw image 184 was generated from MRI data acquired during a non-Cartesian MRI scan of a hip of a subject. The raw image 184 was acquired during a scan at a lower bandwidth (e.g., relative to the appearance of the chemical shift artifact corrected reconstructed image 188). The trained deep neural network 182 utilized a tissue mixing model that models fat-water interactions to mitigate chemical shift artifacts to generate the chemical shift artifact corrected reconstructed image 188. In particular, the trained deep neural network 182 utilized a partial volume map to approximate a respective fraction of fat and water in each voxel of the raw image 184 and simulated phase accrual in fat tissue and water tissue based on known chemical shift evolution. In certain embodiments, the tissue mixing model may simulate phase accrual in multiple tissue components (e.g., multiple fat tissue peaks and water tissue, fat tissue, water tissue, and silicone, etc.) based on known chemical shift evolution. Besides performing chemical shift correction on the raw image, the trained deep neural network 182 also performed de-noising and de-ringing on the raw image 184 so that the chemical shift artifact corrected reconstructed image 188 is also a denoised and ringing reduced image. The chemical shift artifact corrected reconstructed image 188 appears more MRI like than the raw image 184. In particular, the chemical shift artifact corrected reconstructed image 188 appears like an MRI image acquired at a higher receiver bandwidth (i.e., higher than the lower bandwidth).

Figure 5:
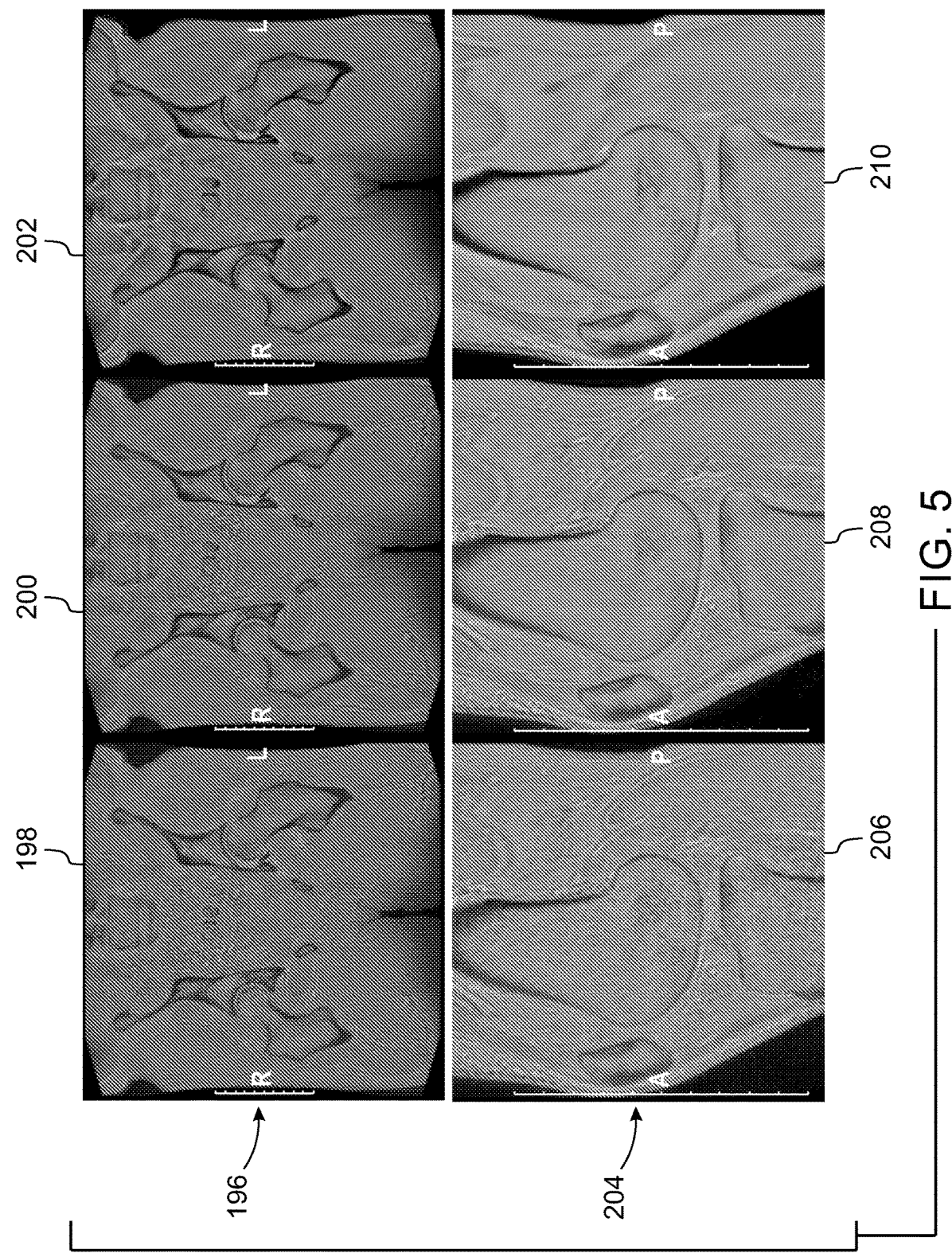
FIG. 5 illustrates a comparison of MRI images derived from input data utilizing different techniques, in accordance with aspects of the present disclosure.

FIG. 5 illustrates a comparison of MRI images derived from input data utilizing different techniques. A top row 196 of MRI images are of a hip of a subject. The top row 196 of MRI images includes a raw image 198 (i.e., image generated from complex-combined individual receiver coil channels but prior to further processing). The raw image 198 was generated from MRI data acquired during a non-Cartesian MRI scan. The raw image 198 has noise. The raw image 198 was acquired during a scan at a lower bandwidth (e.g., relative to the appearance of the chemical shift artifact corrected reconstructed image 202). The raw image 198 was inputted into different trained deep learning networks. The first trained deep learning network is only trained for noise and ringing reduction. The second trained deep learning network (e.g., trained deep learning network 182 in FIG. 3) is trained for mitigating chemical shift artifacts and also for performing de-noising and de-ringing. The top row 196 of MRI images also includes reconstructed MRI image 200 generated utilizing the first trained deep learning network trained for noise and ringing reduction. The top row 196 of MRI images further includes reconstructed MRI image 202 generated utilizing the second trained deep learning network trained for mitigating chemical shift artifacts and also for performing de-noising and de-ringing. A bottom row 204 of MRI images are of a knee of a subject. The bottom row 204 of MRI images includes a raw image 206 (i.e., image generated from complex-combined individual receiver coil channels but prior to further processing). The raw image 206 was generated from MRI data acquired during a non-Cartesian MRI scan. The raw image 206 has noise. The raw image 206 was also inputted into the different trained deep learning networks. The bottom row 204 of MRI images also includes reconstructed MRI image 208 generated utilizing the first trained deep learning network trained for noise and ringing reduction. The bottom row 204 of MRI images further includes reconstructed MRI image 210 generated utilizing the second trained deep learning network trained for mitigating chemical shift artifacts and also for performing de-noising and de-ringing. As depicted in FIG. 5, the reconstructed MRI images 202 and 210 (e.g., chemical shift corrected reconstructed MRI images) have a significantly improved fat-water interface depicted compared to respective reconstructed MRI images 200 and 208.

Figure 6:
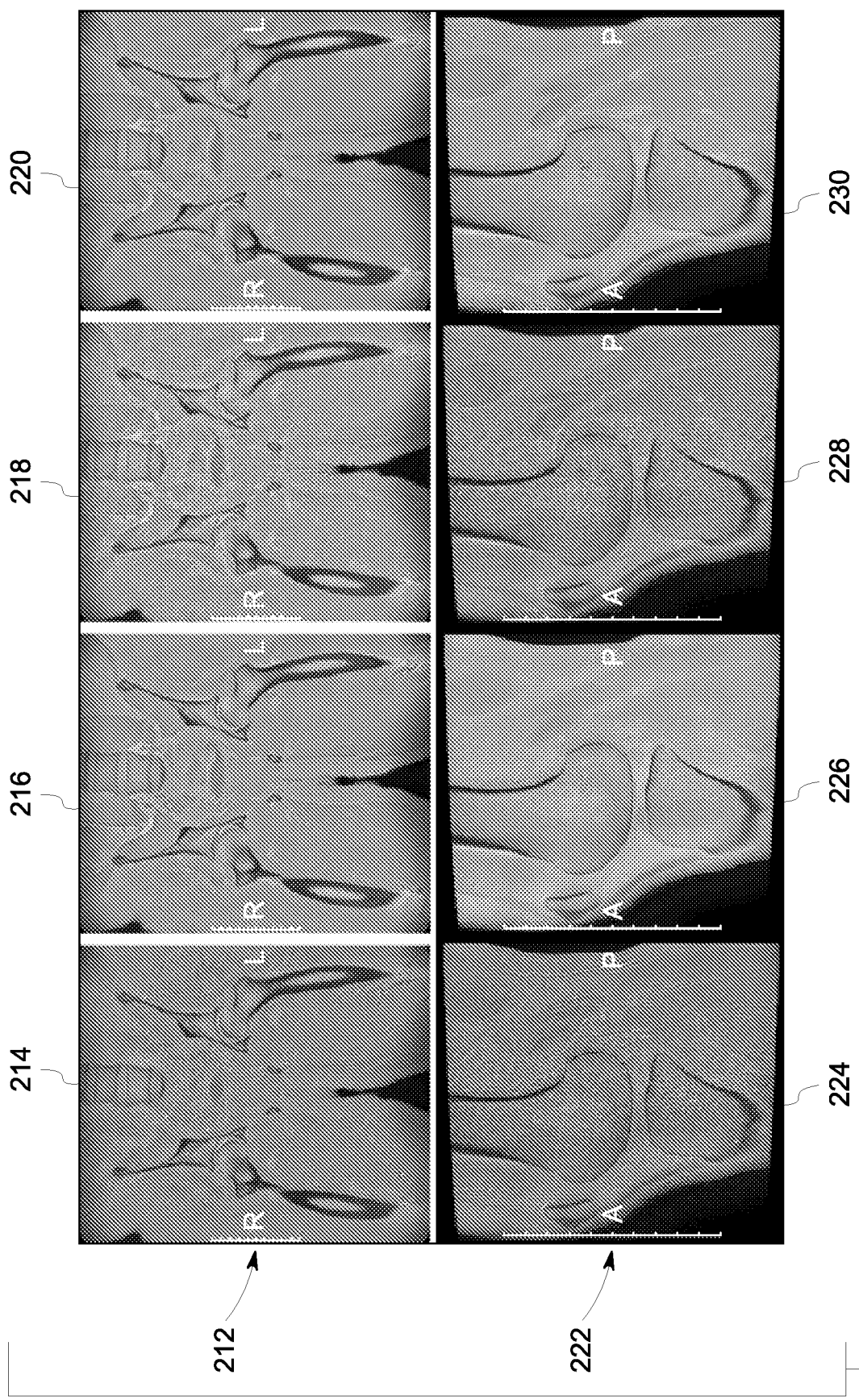
FIG. 6 illustrates utilization of on-resonance images and off-resonance images with a trained deep learning neural network for mitigating chemical shift artifacts, in accordance with aspects of the present disclosure.

FIG. 6 illustrates utilization of on-resonance images and off-resonance images with the trained deep learning neural network for mitigating chemical shift artifacts. A top row 212 of MRI images are of a hip of a subject. The top row 212 of MRI images includes a raw image 214 (i.e., image generated from complex-combined individual receiver coil channels but prior to further processing). The raw image 214 was generated from MRI data acquired during a non-Cartesian MRI scan. The raw image 214 was generated from an on-resonance scan with the center frequency on water. The raw image 214 was acquired during a scan at a lower bandwidth (e.g., relative to the appearance of the chemical shift artifact corrected reconstructed image 216). The raw image 214 was inputted into a trained deep learning network (e.g., trained deep learning network 182 in FIG. 3) trained for mitigating chemical shift artifacts and also for performing de-noising and de-ringing. The trained deep learning network is a single image input network. The top row 212 of MRI images also includes reconstructed MRI image 216 (e.g., chemical shift corrected reconstructed MRI image) generated utilizing the trained deep learning network trained for mitigating chemical shift artifacts and also for performing de-noising and de-ringing.

The top row 212 of MRI images includes another raw image 218 (i.e., image generated from complex-combined individual receiver coil channels but prior to further processing). The raw image 218 was generated from MRI data acquired during a non-Cartesian MRI scan. The raw image 218 was generated from an off-resonance scan (e.g., partially in phase scan) with the center frequency between fat and water. The raw image 218 was acquired during a scan at a lower bandwidth (e.g., relative to the appearance of the chemical shift artifact corrected reconstructed image 220). The raw image 218 was inputted into the same trained deep learning network trained for mitigating chemical shift artifacts and also for performing de-noising and de-ringing. The top row 212 of MRI images also includes reconstructed MRI image 220 (e.g., chemical shift corrected reconstructed MRI image) generated utilizing the trained deep learning network trained for mitigating chemical shift artifacts and also for performing de-noising and de-ringing.

A bottom row 222 of MRI images are of a knee of a subject. The bottom row 222 of MRI images includes a raw image 224 (i.e., image generated from complex-combined individual receiver coil channels but prior to further processing). The raw image 224 was generated from MRI data acquired during a non-Cartesian MRI scan. The raw image 224 was generated from an on-resonance scan with the center frequency on water. The raw image 224 was acquired during a scan at a lower bandwidth (e.g., relative to the appearance of the chemical shift artifact corrected reconstructed image 226). The raw image 224 was also inputted into the trained deep learning network trained for mitigating chemical shift artifacts and also for performing de-noising and de-ringing. The trained deep learning network is a single image input network. The bottom row 222 of MRI images also includes reconstructed MRI image 226 (e.g., chemical shift corrected reconstructed MRI image) generated utilizing the trained deep learning network trained for mitigating chemical shift artifacts and also for performing de-noising and de-ringing.

The bottom row 222 of MRI images includes another raw image 228 (i.e., image generated from complex-combined individual receiver coil channels but prior to further processing). The raw image 228 was generated from MRI data acquired during a non-Cartesian MRI scan. The raw image 228 was generated from an off-resonance scan (e.g., partially in phase scan) with the center frequency between fat and water. The raw image 28 was acquired during a scan at a lower bandwidth (e.g., relative to the appearance of the chemical shift artifact corrected reconstructed image 230). The raw image 228 was inputted into the same trained deep learning network trained for mitigating chemical shift artifacts and also for performing de-noising and de-ringing. The bottom row 222 of MRI images also includes reconstructed MRI image 230 (e.g., chemical shift corrected reconstructed MRI image) generated utilizing the trained deep learning network trained for mitigating chemical shift artifacts and also for performing de-noising and de-ringing. As shown in reconstructed MRI images 216, 220, 226, and 230 in FIG. 6, the trained deep learning network works effectively on MRI data derived from both on-resonance scans and off-resonance scans mitigating chemical shift artifacts and also for performing de-noising and de-ringing.

Figure 7:
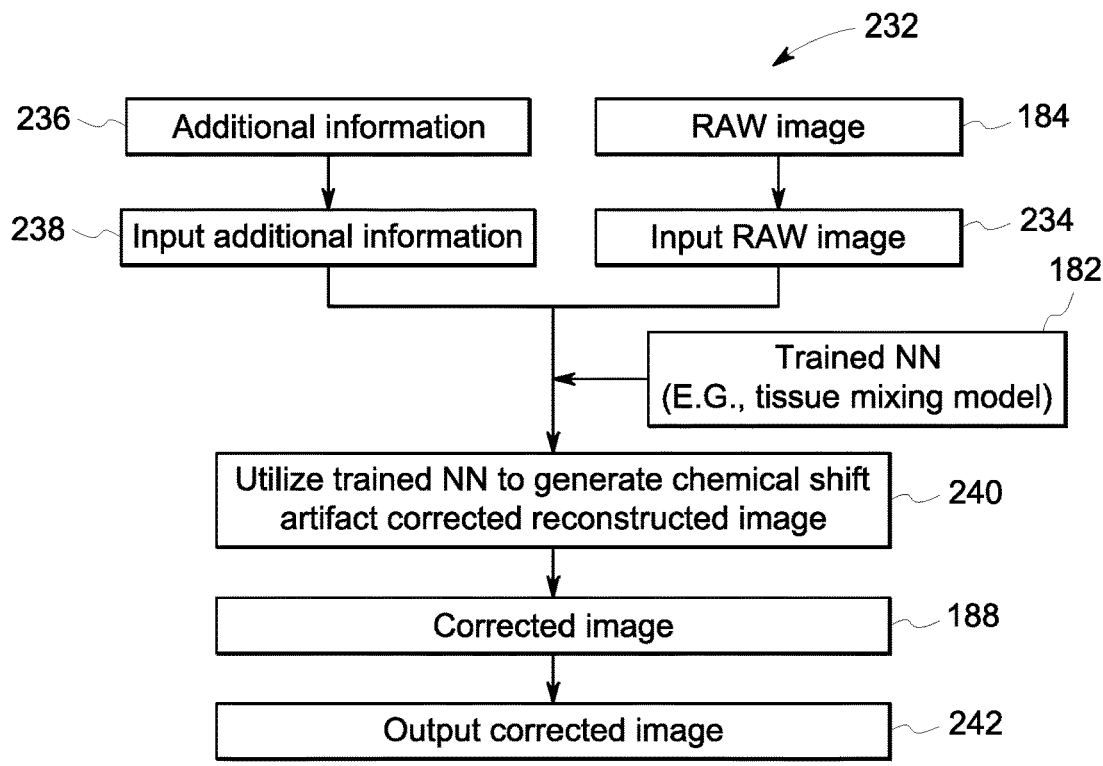
FIG. 7 is a flow chart of a method for generating a chemical shift artifact corrected reconstructed image from MRI data (e.g., utilizing an input image and additional information), in accordance with aspects of the present disclosure.

FIG. 7 is a flow chart of a method 232 for generating a chemical shift artifact corrected reconstructed image from MRI data (e.g., utilizing an input image and additional information). One or more steps of the method 232 may be performed by processing circuitry of the magnetic resonance imaging system 100 in FIG. 2 or a remote computing system. One or more steps of the method 232 may be performed simultaneously or in a different order from that depicted in FIG. 7.

The method 232 includes inputting into a trained deep neural network (NN) 182 a raw image 184 (i.e., image generated from complex-combined individual receiver coil channels but prior to further processing) generated from the MRI data acquired during a non-Cartesian MRI scan of a subject (block 234). The raw image 184 is generated from the MRI data acquired during a non-Cartesian MRI scan of a subject is input into the trained deep neural network 182. The MRI data (e.g., k-space data) may have been acquired or sampled utilizing a spiral trajectory, a radial trajectory, a zig-zag trajectory, or any other non-Cartesian trajectory. The non-Cartesian scan may be an on-resonance scan (i.e., center frequency on water) or an off-resonance image (i.e., center frequency not on water). The raw image 184 may be acquired during a scan at a lower bandwidth (i.e., lower than the bandwidth at which the chemical shift artifact corrected reconstructed image appears to have been acquired at). The trained deep neural network 182 is as described in FIG. 3.

The method 232 also includes inputting additional information 236 into the trained deep neural network 182 to guide the mitigation or correction of chemical shift artifacts in the raw image 184 (block 238). In certain embodiments, the additional information may be physics-based information.

The method 232 also includes utilizing the trained deep neural network 182 to generate a chemical shift artifact corrected reconstructed image 188 from the raw image 184, wherein the trained deep neural network 182 utilizes the tissue mixing model that models fat-water interactions to mitigate chemical shift artifacts (block 240). The trained deep neural network 182 utilizes the additional information 236 to guide the mitigation or correction of chemical shift artifacts in the raw image 184. In certain embodiments, both the raw image 184 and the chemical shift artifact corrected reconstructed image 188 are two-dimensional (2D) images. In certain embodiments, both the raw image 184 and the chemical shift artifact corrected reconstructed image 188 are three-dimensional (3D) images. The method 232 further includes outputting from the trained deep neural network the chemical shift artifact corrected reconstructed image (block 242).

Figure 8:
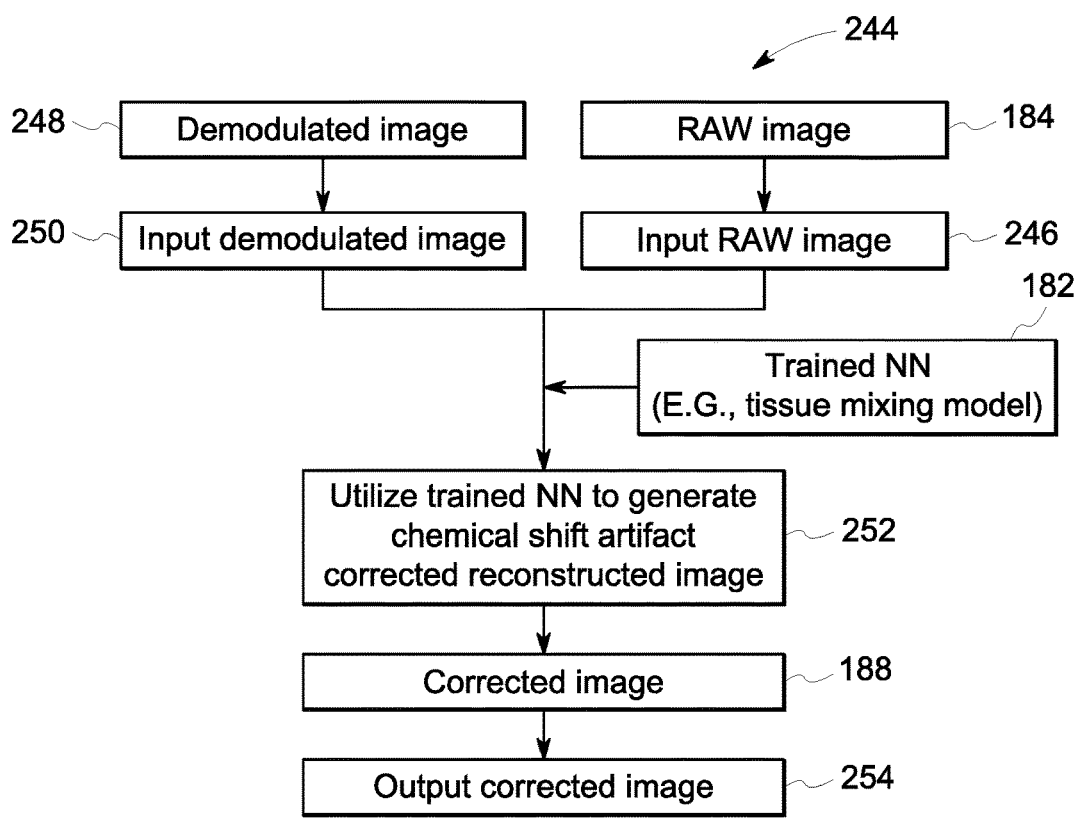
FIG. 8 is a flow chart of a method for generating a chemical shift artifact corrected reconstructed image from MRI data (e.g., utilizing an input image and a demodulated image), in accordance with aspects of the present disclosure.

FIG. 8 is a flow chart of a method 244 for generating a chemical shift artifact corrected reconstructed image from MRI data (e.g., utilizing an input image and a demodulated image). One or more steps of the method 244 may be performed by processing circuitry of the magnetic resonance imaging system 100 in FIG. 2 or a remote computing system. One or more steps of the method 244 may be performed simultaneously or in a different order from that depicted in FIG. 8.

The method 244 includes inputting into a trained deep neural network (NN) 182 a raw image 184 (i.e., image generated from complex-combined individual receiver coil channels but prior to further processing) generated from the MRI data acquired during a non-Cartesian MRI scan of a subject (block 246). The raw image 184 is generated from the MRI data acquired during a non-Cartesian MRI scan of a subject is input into the trained deep neural network 182. The MRI data (e.g., k-space data) may have been acquired or sampled utilizing a spiral trajectory, a radial trajectory, a zig-zag trajectory, or any other non-Cartesian trajectory. The non-Cartesian scan may be an on-resonance scan (i.e., center frequency on water) or an off-resonance image (i.e., center frequency not on water). The raw image 184 may be acquired during a scan at a lower bandwidth (i.e., lower than the bandwidth at which the chemical shift artifact corrected reconstructed image appears to have been acquired at). The trained deep neural network 182 is as described in FIG. 3.

The method 244 also includes inputting a demodulated image 248 into the trained deep neural network 182 to guide the mitigation or correction of chemical shift artifacts in the raw image 184 (block 250). The demodulated image 248 is an off-resonance MRI image retrospectively generated from the MRI data that the raw image 184 is generated from.

The method 244 also includes utilizing the trained deep neural network 182 to generate a chemical shift artifact corrected reconstructed image 188 from the raw image 184, wherein the trained deep neural network 182 utilizes the tissue mixing model that models fat-water interactions to mitigate chemical shift artifacts (block 252). The trained deep neural network 182 utilizes the demodulated image 248 to guide the mitigation or correction of chemical shift artifacts in the raw image 184. In certain embodiments, the raw image 184, the demodulated image 248, and the chemical shift artifact corrected reconstructed image 188 are two-dimensional (2D) images. In certain embodiments, the raw image 184, the demodulated image 248, and the chemical shift artifact corrected reconstructed image 188 are three-dimensional (3D) images. The method 244 further includes outputting from the trained deep neural network the chemical shift artifact corrected reconstructed image (block 254).

Figure 9:
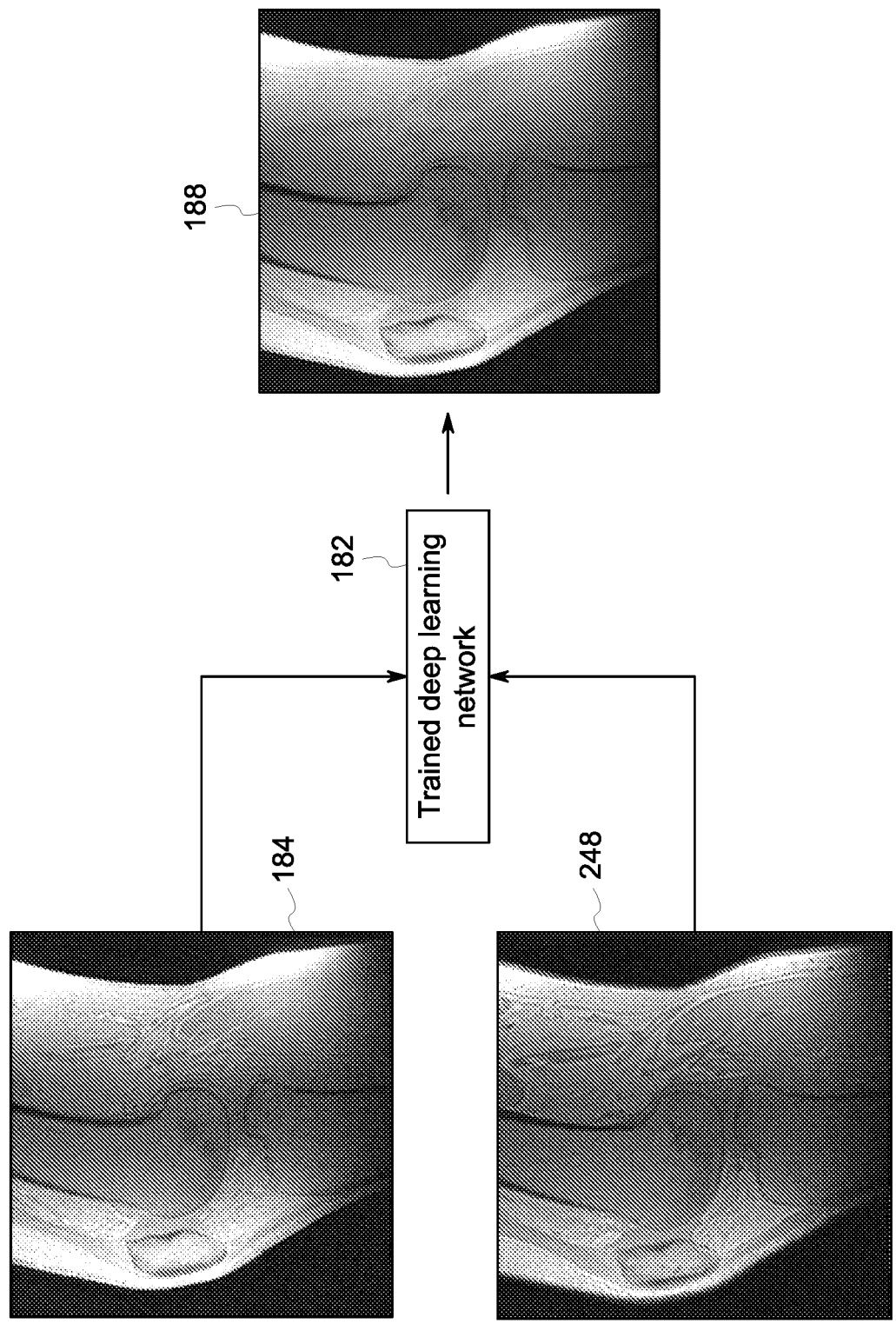
FIG. 9 is a schematic diagram illustrating the mitigation of chemical shift artifacts in a raw image (e.g., utilizing an input image and a demodulated image), in accordance with aspects of the present disclosure.

FIG. 9 is a schematic diagram illustrating the mitigation of chemical shift artifacts in a raw image 184 (e.g., utilizing an input image and a demodulated image). As depicted in FIG. 4, the raw image 184 is input into the trained deep neural network 182. The raw image 184 was generated from MRI data acquired during a non-Cartesian MRI scan of a knee of a subject. The raw image 184 was acquired during an on-resonance scan with the center frequency on water. The raw image 184 was acquired during a scan at a lower bandwidth. In addition, the demodulation image 248 is input into the trained deep neural network 182. The demodulated image 248 is an off-resonance MRI image retrospectively generated from the MRI data that the raw image 184 was generated from. In particular, the demodulated image 248 was demodulated to have the center frequency on fat. The trained deep neural network 182 utilized a tissue mixing model that models fat-water interactions to mitigate chemical shift artifacts to generate the chemical shift artifact corrected reconstructed image 188. In particular, the trained deep neural network 182 utilized a partial volume map to approximate a respective fraction of fat and water in each voxel of the raw image 184 and simulated phase accrual in fat tissue and water tissue based on known chemical shift evolution. In addition, the trained deep neural network 182 utilized the demodulate image 248 to guide the mitigation or correction of chemical shift artifacts in the raw image 184. Besides performing chemical shift correction on the raw image, the trained deep neural network 182 also performed de-noising and de-ringing on the raw image 184 so that the chemical shift artifact corrected reconstructed image 188 is also a denoised and ringing reduced image. The chemical shift artifact corrected reconstructed image 188 appears more MRI like than the raw image 184. In particular, the chemical shift artifact corrected reconstructed image 188 appears like an MRI image acquired at a higher receiver bandwidth (i.e., higher than the lower bandwidth).

Figure 10:
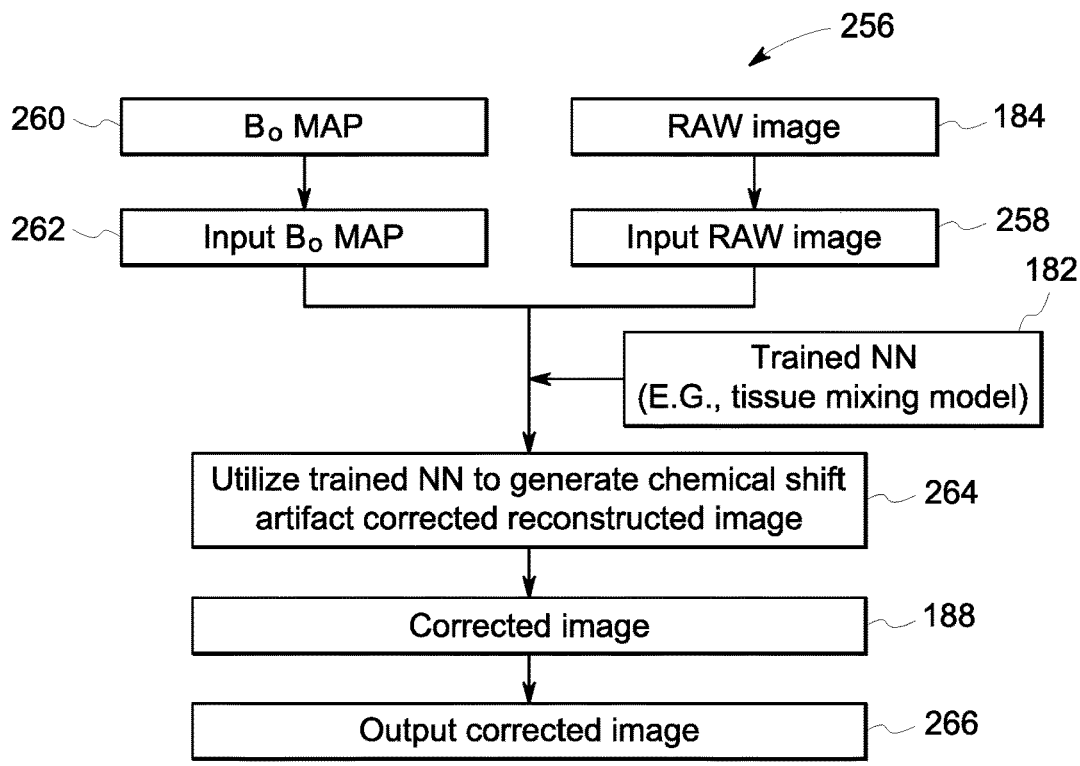
FIG. 10 is a flow chart of a method for generating a chemical shift artifact corrected reconstructed image from MRI data (e.g., utilizing an input image and a $B_0$ map), in accordance with aspects of the present disclosure.

FIG. 10 is a flow chart of a method 256 for generating a chemical shift artifact corrected reconstructed image from MRI data (e.g., utilizing an input image and a $B_0$ map). One or more steps of the method 256 may be performed by processing circuitry of the magnetic resonance imaging system 100 in FIG. 2 or a remote computing system. One or more steps of the method 256 may be performed simultaneously or in a different order from that depicted in FIG. 10.

The method 256 includes inputting into a trained deep neural network (NN) 182 a raw image 184 (i.e., image generated from complex-combined individual receiver coil channels but prior to further processing) generated from the MRI data acquired during a non-Cartesian MRI scan of a subject (block 258). The raw image 184 is generated from the MRI data acquired during a non-Cartesian MRI scan of a subject is input into the trained deep neural network 182. The MRI data (e.g., k-space data) may have been acquired or sampled utilizing a spiral trajectory, a radial trajectory, a zig-zag trajectory, or any other non-Cartesian trajectory. The non-Cartesian scan may be an on-resonance scan (i.e., center frequency on water) or an off-resonance image (i.e., center frequency not on water). The raw image 184 may be acquired during a scan at a lower bandwidth. The trained deep neural network 182 is as described in FIG. 3.

The method 256 also includes inputting a $B_0$ map 260 (i.e., a map of a primary magnetic field of an MRI system utilized to acquire the MRI data) into the trained deep neural network 182 to guide the mitigation or correction of chemical shift artifacts in the raw image 184 (block 262). The method 256 also includes utilizing the trained deep neural network 182 to generate a chemical shift artifact corrected reconstructed image 188 from the raw image 184, wherein the trained deep neural network 182 utilizes the tissue mixing model that models fat-water interactions to mitigate chemical shift artifacts (block 264). The trained deep neural network 182 utilizes the $B_0$ map 260 to guide the mitigation or correction of chemical shift artifacts in the raw image 184. In certain embodiments, the raw image 184 and the chemical shift artifact corrected reconstructed image 188 are two-dimensional (2D) images. In certain embodiments, the raw image 184 and the chemical shift artifact corrected reconstructed image 188 are three-dimensional (3D) images. The method 256 further includes outputting from the trained deep neural network the chemical shift artifact corrected reconstructed image (block 266).

Figure 11:
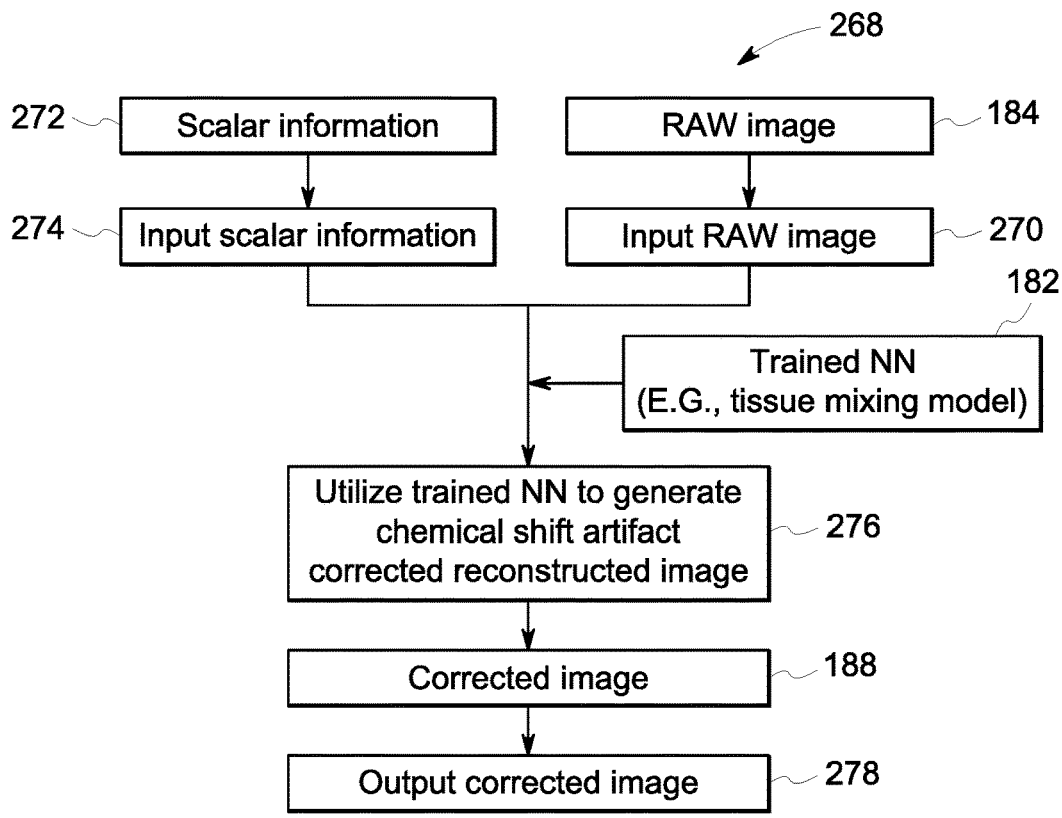
FIG. 11 is a flow chart of a method for generating a chemical shift artifact corrected reconstructed image from MRI data (e.g., utilizing an input image and scalar information), in accordance with aspects of the present disclosure.

FIG. 11 is a flow chart of a method 268 for generating a chemical shift artifact corrected reconstructed image from MRI data (e.g., utilizing an input image and scalar information). One or more steps of the method 268 may be performed by processing circuitry of the magnetic resonance imaging system 100 in FIG. 2 or a remote computing system. One or more steps of the method 268 may be performed simultaneously or in a different order from that depicted in FIG. 11.

The method 268 includes inputting into a trained deep neural network (NN) 182 a raw image 184 (i.e., image generated from complex-combined individual receiver coil channels but prior to further processing) generated from the MRI data acquired during a non-Cartesian MRI scan of a subject (block 270). The raw image 184 is generated from the MRI data acquired during a non-Cartesian MRI scan of a subject is input into the trained deep neural network 182. The MRI data (e.g., k-space data) may have been acquired or sampled utilizing a spiral trajectory, a radial trajectory, a zig-zag trajectory, or any other non-Cartesian trajectory. The non-Cartesian scan may be an on-resonance scan (i.e., center frequency on water) or an off-resonance image (i.e., center frequency not on water). The raw image 184 may be acquired during a scan at a lower bandwidth. The trained deep neural network 182 is as described in FIG. 3.

The method 268 also includes inputting scalar information 272 into the trained deep neural network 182 to guide the mitigation or correction of chemical shift artifacts in the raw image 184 (block 274). The scalar information 272 may include one or more of read-out length, field strength, or other scalar information.

The method 268 also includes utilizing the trained deep neural network 182 to generate a chemical shift artifact corrected reconstructed image 188 from the raw image 184, wherein the trained deep neural network 182 utilizes the tissue mixing model that models fat-water interactions to mitigate chemical shift artifacts (block 276). The trained deep neural network 182 utilizes the scalar information 272 to guide the mitigation or correction of chemical shift artifacts in the raw image 184. In certain embodiments, the raw image 184 and the chemical shift artifact corrected reconstructed image 188 are two-dimensional (2D) images. In certain embodiments, the raw image 184 and the chemical shift artifact corrected reconstructed image 188 are three-dimensional (3D) images. The method 268 further includes outputting from the trained deep neural network the chemical shift artifact corrected reconstructed image (block 278).

Figure 12:
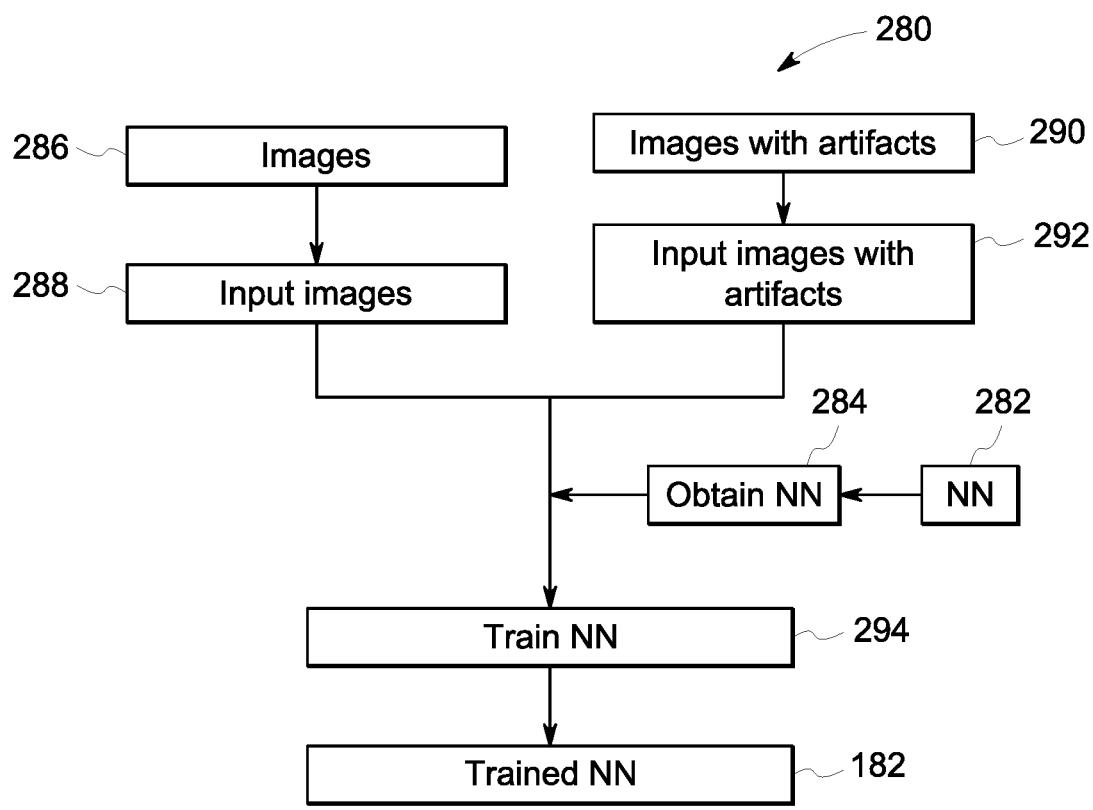
FIG. 12 is a flow chart of a method for training a neural network to generate a chemical shift artifact corrected reconstructed image from MRI data, in accordance with aspects of the present disclosure.

FIG. 12 is a flow chart of a method 280 for training a neural network to generate a chemical shift artifact corrected reconstructed image from MRI data. One or more steps of the method 280 may be performed by processing circuitry of the magnetic resonance imaging system 100 in FIG. 2 or a remote computing system. One or more steps of the method 280 may be performed simultaneously or in a different order from that depicted in FIG. 12.

The method 280 includes obtaining a neural network 282 (block 284). The method 280 also includes inputting into the neural network 282 MRI images 286 without chemical shift artifacts (block 288). The method 280 further includes inputting into the neural network 282 MRI images 290 with chemical shift artifacts corresponding to the MRI images 286 (block 292). In particular, the MRI images 290 are retrospectively generated from the MRI images 286 by introducing chemical shift artifacts into the MRI images 286. The MRI images 286 serve as the ground truth. The method 280 even further includes training the neural network using supervised learning to generate the trained deep neural network 182 utilizing both the MRI images 286 and the MRI images 290 (block 294). The deep neural network 182 is trained to utilize a tissue mixing model that models fat-water interactions to mitigate chemical shift artifacts in generating chemical shift artifact corrected reconstructed images. The trained deep neural network 182 is trained to perform de-noising and de-ringing. In certain embodiments, the tissue mixing model is a partial volume map (e.g., for two classes, fat and water) for approximating a respective fraction of fat and water (e.g., in a range from 0 to 1) in each voxel of a raw image. The tissue mixing model is configured to simulate phase accrual in fat tissue and water tissue based on known chemical shift evolution. The trained deep neural network 182 is also trained to make the raw image (e.g., acquired at a lower receiver bandwidth) to appear in the chemical shift artifact corrected reconstructed image as an image acquired at a higher receiver bandwidth (i.e., higher than the lower receiver bandwidth). In certain embodiments, the neural network 282 may be trained with different inputs. For example, the neural network 282 may be trained with MRI images that have been split into a fat image and a water image to simulate compound separation and the original MRI image may serve as the ground truth. In certain embodiments, the neural network 282 may be trained with $B_0$ inhomogeneity off-resonance introduced into the network 282 to enable chemical shift correction or mitigation.

Figure 13:
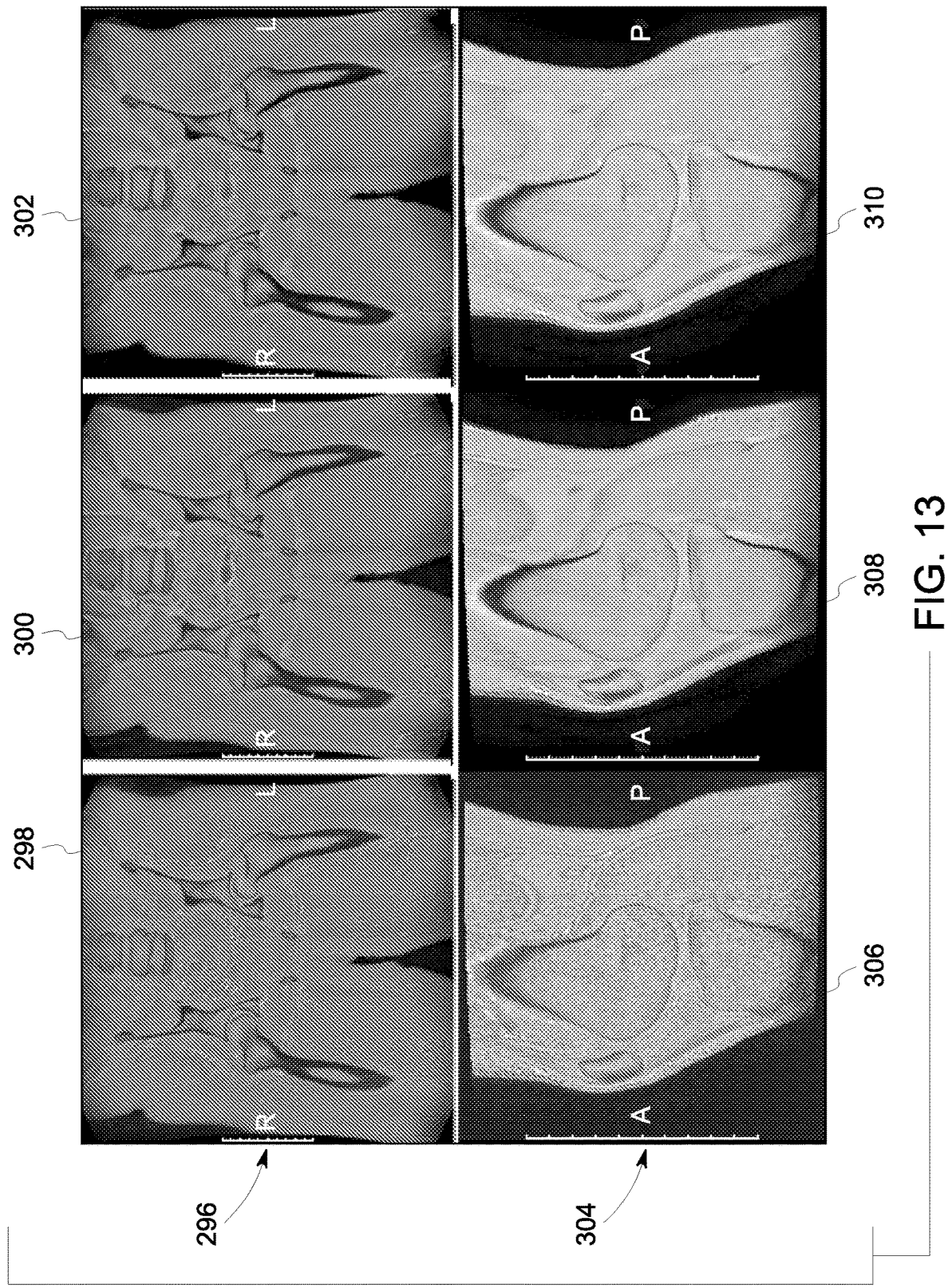
FIG. 13 illustrates a comparison of MRI images chemical shift corrected at different levels, in accordance with aspects of the present disclosure.

As mentioned above, a user may provide an input of a selection to either fully remove or partially remove a chemical shift artifact in a raw image. FIG. 13 illustrates a comparison of MRI images chemical shift corrected at different levels. A top row 296 of MRI images are of a hip of a subject. The top row 296 of MRI images includes a reconstructed image 298 without chemical shift correction. The top row 296 of MRI images also includes reconstructed MRI image 300 with full chemical shift correction generated utilizing a trained deep learning network trained for mitigating chemical shift artifacts and also for performing de-noising and de-ringing (e.g., trained deep learning network 182 in FIG. 3). The top row 296 of MRI images further includes reconstructed MRI image 302 with partial chemical shift correction generated utilizing the trained deep learning network trained for mitigating chemical shift artifacts and also for performing de-noising and de-ringing. A bottom row 304 of MRI images are of a knee of a subject. The bottom row 304 of MRI images includes a reconstructed image 306 without chemical shift correction. The bottom row 304 of MRI images also includes reconstructed MRI image 308 with full chemical shift correction generated utilizing a trained deep learning network trained for mitigating chemical shift artifacts and also for performing de-noising and de-ringing (e.g., trained deep learning network 182 in FIG. 3). The bottom row 304 of MRI images further includes reconstructed MRI image 310 with partial chemical shift correction generated utilizing the trained deep learning network trained for mitigating chemical shift artifacts and also for performing de-noising and de-ringing.

Technical effects of the disclosed subject matter include enabling improved image quality by mitigating chemical shift artifacts (e.g., fat-water tissue interface artifacts) in MRI data. The disclosed embodiments also enable improved image quality by reducing blurring and performing de-noising and de-ringing in the MRI data. Reduction of the chemical shift artifacts makes the images appear more "MR like" (i.e., akin to high bandwidth images) making it easier for radiologists to read them. The disclosed embodiments further enable improvements in post-processing tasks (e.g., bone rendering for zero echo time (ZTE) type scans, or synthetic CT image conversion).

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for generating a chemical shift artifact corrected reconstructed image from magnetic resonance imaging (MRI) data, comprising:
   inputting into a trained deep neural network an image generated from the MRI data acquired during a non-Cartesian MRI scan of a subject;
   utilizing the trained deep neural network to generate the chemical shift artifact corrected reconstructed image from the image, wherein the trained deep neural network was trained utilizing a tissue mixing model that models interactions between different tissue types to mitigate chemical shift artifacts, and wherein the tissue mixing model comprises a partial volume map for approximating a respective fraction of the different tissue types in each voxel of the image; and
   outputting from the trained deep neural network the chemical shift artifact corrected reconstructed image.

2. The computer-implemented method of claim 1, wherein the MRI data is acquired at a lower receiver bandwidth, and the chemical shift artifact corrected reconstructed image appears as generated from MRI data acquired at a higher receiver bandwidth, wherein the higher receiver bandwidth is greater than the lower receiver bandwidth.

3. The computer-implemented method of claim 1, further comprising training a neural network using supervised learning to generate the trained deep neural network, wherein training data used for the supervised learning comprises original images without chemical shift artifacts and corresponding images with chemical shift artifacts retrospectively generated from the original images, wherein the original images function as a ground truth.

4. The computer-implemented method of claim 1, wherein the tissue mixing model is configured to simulate phase accrual of the different tissue types with known chemical shift evolution.

5. The computer-implemented method of claim 1, further comprising receiving an input of a user selection of either fully removing or partially removing a chemical shift artifact in the image, wherein, when the input of the user selection is for fully removing the chemical shift artifact, the chemical shift artifact is fully removed from the chemical shift artifact corrected reconstructed image, and wherein, when the input of the user selection is for partially removing the chemical shift artifact, the chemical shift artifact is partially removed from the chemical shift artifact corrected reconstructed image.

6. The computer-implemented method of claim 1, wherein the image is the only image inputted into the trained deep neural network to generate the chemical shift artifact corrected reconstructed image.

7. The computer-implemented method of claim 1, wherein the non-Cartesian MRI scan comprises an on-resonance scan.

8. The computer-implemented method of claim 1, wherein the non-Cartesian MRI scan comprises an off-resonance scan.

9. The computer-implemented method of claim 1, further comprising inputting physics-based information into the trained deep neural network, wherein the trained deep neural network utilizes the physics-based information to guide correction in generating the chemical shift artifact corrected reconstructed image.

10. The computer-implemented method of claim 9, wherein the physics-based information comprises one or more MRI images at different frequencies generated from the original MRI data.

11. The computer-implemented method of claim 9, wherein the physics-based information comprises a map of a primary magnetic field of an MRI system utilized to acquire the MRI data.

12. The computer-implemented method of claim 9, wherein the physics-based information comprises scalar information.

13. The computer-implemented method of claim 1, wherein the image and the chemical shift artifact corrected reconstructed image are two-dimensional images.

14. The computer-implemented method of claim 1, wherein the image and the chemical shift artifact corrected reconstructed image are three-dimensional images.

15. A non-transitory computer-readable medium, the computer-readable medium comprising processor-executable code that when executed by a processor, causes the processor to:
   input into a trained deep neural network an image generated from magnetic resonance imaging (MRI) data acquired during a non-Cartesian MRI scan of a subject;
   utilize the trained deep neural network to generate a chemical shift artifact corrected data from the image, wherein the trained deep neural network was trained utilizing a tissue mixing model that models interactions between different tissue types to mitigate chemical shift artifacts, and wherein the tissue mixing model comprises a partial volume map for approximating a respective fraction of the different tissue types in each voxel of the image; and
   output from the trained deep neural network the chemical shift artifact corrected data.

16. A deep learning-based chemical shift artifact correction system for generating a chemical shift artifact corrected data from magnetic resonance imaging (MRI) data, comprising:
   a memory encoding processor-executable routines;
   a processor configured to access the memory and to execute the processor-executable routines, wherein the routines, when executed by the processor, cause the processor to:
      input into a trained deep neural network an image generated from the MRI data acquired during a non-Cartesian MRI scan of a subject;
      utilize the trained deep neural network to generate the chemical shift artifact corrected data from the image, wherein the trained deep neural network was trained utilizing a tissue mixing model that models interactions between different tissue types to mitigate chemical shift artifacts, and wherein the tissue mixing model comprises a partial volume map for approximating a respective fraction of the different tissue types in each voxel of the image; and output from the trained deep neural network the chemical shift artifact corrected data.

17. The system of claim 16, wherein the routines, when executed by the processor, cause the processor to input physics-based information into the trained deep neural network, wherein the trained deep neural network is configured to utilize the physics-based information to guide correction in generating the chemical shift artifact corrected data.

\* \* \* \* \*